United States Patent

Robbins et al.

[11] Patent Number: 6,002,280
[45] Date of Patent: Dec. 14, 1999

[54] ADAPTABLE OUTPUT PHASE DELAY COMPENSATION CIRCUIT AND METHOD THEREOF

[75] Inventors: Dan Robbins, Durham; Scott Tucker, Raleigh; James C. Morizio, Durham, all of N.C.

[73] Assignee: Mitsubishi Semiconductor America, Inc., Durham, N.C.

[21] Appl. No.: 08/842,441

[22] Filed: Apr. 24, 1997

[51] Int. Cl.⁶ .................................................. H03L 7/06
[52] U.S. Cl. .................... 327/156; 327/157; 327/236; 327/244; 331/34
[58] Field of Search .................... 327/155, 156, 327/157, 236, 243–245, 141, 158, 161; 331/34, 177 R, 17; 375/373, 374, 376, 375

[56] References Cited

U.S. PATENT DOCUMENTS

| | | | |
|---|---|---|---|
| 3,114,109 | 12/1963 | Melas | 328/63 |
| 4,383,216 | 5/1983 | Dorler et al. | 327/530 |
| 4,590,602 | 5/1986 | Wolaver | 375/375 |
| 4,729,024 | 3/1988 | Kawai et al. | 327/141 |
| 4,833,695 | 5/1989 | Greub | 331/57 |
| 4,939,389 | 7/1990 | Cox et al. | 327/297 |
| 5,097,489 | 3/1992 | Tucci | 327/141 |
| 5,157,696 | 10/1992 | Hara | 327/141 |
| 5,272,390 | 12/1993 | Watson, Jr. et al. | 327/141 |
| 5,272,729 | 12/1993 | Bechade et al. | 327/141 |
| 5,298,867 | 3/1994 | Mestha | 331/17 |
| 5,307,381 | 4/1994 | Ahuja | 375/107 |
| 5,309,035 | 5/1994 | Watson, Jr. et al. | 327/141 |
| 5,369,640 | 11/1994 | Watson et al. | 327/141 |
| 5,373,535 | 12/1994 | Ellis et al. | 327/292 |
| 5,399,994 | 3/1995 | Siniscalchi et al. | 331/17 |
| 5,457,428 | 10/1995 | Alder et al. | 327/141 |
| 5,498,998 | 3/1996 | Gehrke et al. | 327/141 |
| 5,568,078 | 10/1996 | Lee | 327/262 |
| 5,629,651 | 5/1997 | Mizuno | 331/34 |
| 5,663,668 | 9/1997 | Hayashi et al. | 327/156 |
| 5,686,864 | 11/1997 | Martin et al. | 331/17 |

OTHER PUBLICATIONS

U.S. Patent Application No. 08/770,333, filed Dec. 20, 1996, commonly assigned.

Primary Examiner—Timothy P. Callahan
Assistant Examiner—Eunja Shin
Attorney, Agent, or Firm—McDermott, Will & Emery

[57] ABSTRACT

A circuit and method for compensating for the output phase delay of an external clock signal utilizes a phase-locked loop that includes an output port of an integrated circuit device. In the phase-locked loop, a phase detecting circuit compares the external clock signal with an output signal from the output port, producing a phase error signal. The phase error signal is applied to a skew compensator to generate an internal clock signal. The internal clock signal is fed back through the output port to the phase detecting circuit. Clock jitter is reduced by reducing the gain of the skew compensator after a phase lock condition occurs in the compensation circuit.

24 Claims, 3 Drawing Sheets

ADAPTABLE OUTPUT PHASE DELAY COMPENSATION CIRCUIT AND METHOD THEREOF

TECHNICAL FIELD

The invention relates generally to integrated semiconductor chip timing and more particularly to reducing the output phase delay from an input clock signal.

BACKGROUND ART

In a computer system with a plurality of devices interconnected by a communications channel, such as a bus, the overall achievable system speed is determined by the clock period of the communications channel. With reference to FIG. 1(a), device 100 and device 102 are interconnected by channel 110. Device 100 communicates with device 102 by sending output signal Q1 through channel 110 where it is received as data signal D2 by device 102.

The total time budget, T, for the channel clock period is described by the following equation: $T = T_{CTO} + T_Z + T_{SU} + T_{SKEW}$, where $T_{CTO}$ is the input clock to output phase delay of the source device; $T_{SU}$ is the set up time requirement of the destination device; $T_{SKEW}$ is the input clock skew between devices; and $T_Z$ is the transmission settling time of the communication channel.

$T_{CTO}$, the input clock to output phase delay of a source device, is the amount of time taken between the beginning of a clock cycle as determined by clock input signal CLK and when output data signal Q1 is first available at an output port of the source device.

There are several factors responsible for the output phase delay of a device including the time required for the input clock signal to reach an output buffer of the device, the time required to pass a signal through the output buffer, and the delay introduced by a capacitive load on the output port of the device, driven by the output buffer. These factors are difficult to precisely predict because they vary significantly with process, temperature, and supply voltage differences. As a result, $T_{CTO}$ is determined by a tolerance for the maximum acceptable input to output phase delay under a variety of possible operating environments.

$T_Z$, the transmission settling time of the communications channel, is the amount of time between a change in data signal Q1 and the corresponding change in D2. $T_{SU}$, the setup time requirement of the destination device, is how long D2 must be valid before device 102 can read signal D2 at clock signal CLK'. Finally, $T_{SKEW}$ is the input clock skew between devices due to the inherent delay in delivering a clock signal to a plurality of devices. In FIG. 1(a), a clock signal is supplied to device 100 as signal CLK and to device 102 as signal CLK'. As illustrated in FIG. 1(b), each of these delays contributes to the total clock period, T, as $T_{CTO} + T_Z + T_{SU} + T_{SKEW}$.

For a communications channel such as a PC bus, the output phase delay contribution, $T_{CTO}$, accounts for much of the total time budget for the bus. For example, a typical bus timing specification for a 66 MHz bus allocates 7 ns for $T_{CTO}$ or nearly 50% of the 15 ns time budget. A 15 ns clock period for a 32-bit bus has a peak data bandwidth of 267 megabytes per second (MB/s). If the maximum $T_{CTO}$ amount can be reduced to 4 ns, then the clock period for the bus can be reduced to only 12 ns. The data bandwidth for 12 ns bus is about 333 MB/s for an improvement of about 25%. If the maximum output phase delay of a source device can be further reduced to 2 ns, then the resulting data bandwidth is about 400 Mb/s, an improvement of about 50% over specification.

Therefore, it is desirable to tighten the tolerance for the amount of output delay of a semiconductor device.

DISCLOSURE OF THE INVENTION

According to one aspect of the invention, a circuit for generating an internal clock signal with reduced phase delay between an external clock signal and an output signal comprises an input port and an output port, the input port receiving and passing the external clock signal to a phase detecting circuit, and the output port generating an output signal, which is also passed to the phase detecting circuit. The phase detecting circuit compares the phase of the external clock signal as a reference frequency against the phase of the output signal, producing a phase error signal. A skew compensator is coupled to the phase detecting circuit and is configured to produce the internal clock signal responsive to the phase error signal. Finally, the internal clock signal is transmitted to the output port in a feedback loop.

Preferably, the skew compensator comprises a programmable voltage-controlled oscillating circuit having a gain adjust input. The gain adjust input is controlled by a jitter reducing circuit that reduces the gain of the programmable voltage-controlled oscillating circuit after a phase lock condition occurs.

According to another aspect of the invention, an electronic system comprises a first device coupled to a second device through a communications channel. A clock channel supplies an external clock signal to the first and second devices. The first device includes a phase detecting circuit for comparing the external clock signal to an output signal from an output port of the first device to produce a phase error signal. A controllable oscillating circuit generates an internal clock signal responsive to the phase error signal. The internal clock signal is applied to the output port to produce the output signal.

In another aspect, a method of producing an internal clock signal within a device comprises the step of driving the internal clock signal through an output port of the device to produce an output signal. The method further includes receiving an external clock signal and comparing the phase of the external clock signal to the phase of the output signal to produce a phase error signal. The internal clock signal is generated responsively from the phase error signal.

By including the output port in a phase-locked loop that generates the internal clock signal, the input clock to output phase delay is measured in a specific operating environment. Accordingly, the tolerance for $T_{CTO}$ is tightened, allowing the data bandwidth of a communications to be increased.

Still other objects and advantages of the present invention will become readily apparent from the following detailed description, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF DRAWINGS

The present invention is illustrated by way of example, and not by way of limitation, in the figures of the accompanying drawings and in which like reference numerals refer to similar elements and in which.

BEST MODE FOR CARRYING OUT THE INVENTION

A circuit for generating an internal clock signal with reduced phase delay between an external clock signal and an output signal is described. In the following description, for the purposes of explanation, numerous specific details are set forth to provide a thorough understanding of the present invention. It will be apparent, however, that the present invention may be practiced without these specific details. In other instances, well-known structures and devices are shown in block diagram form to avoid unnecessarily obscuring the present invention.

REDUCING THE OUTPUT PHASE DELAY

Figure 1A:
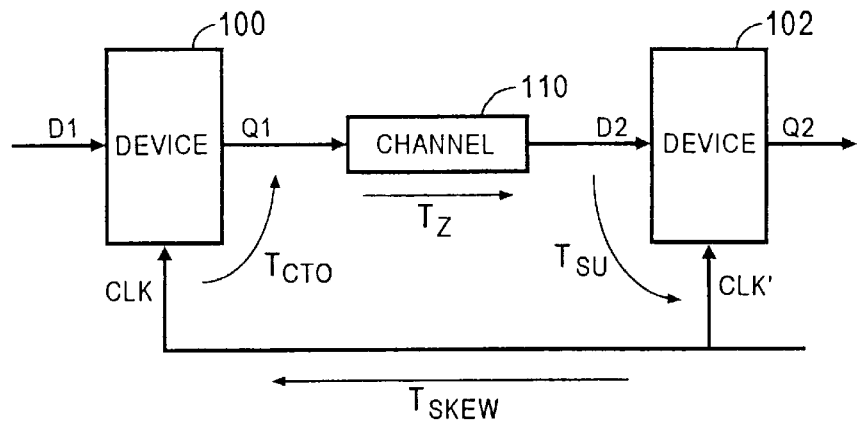
FIG. 1(a) is a high-level block diagram of a system with two interconnected devices.
Figure 1B:
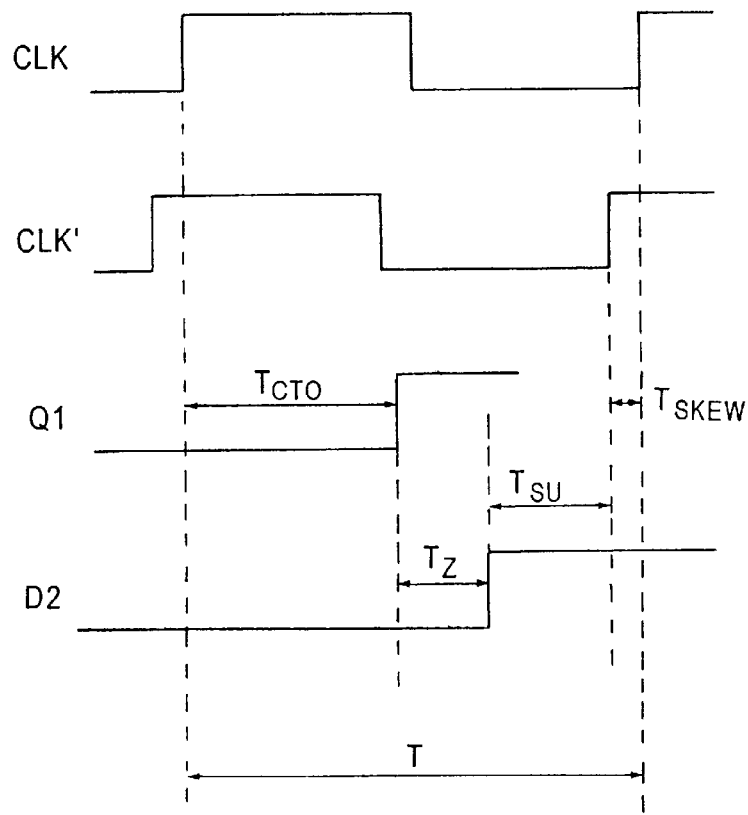
FIG. 1(b) is a timing diagram of the system depicted in FIG. 1(a)
Figure 2:
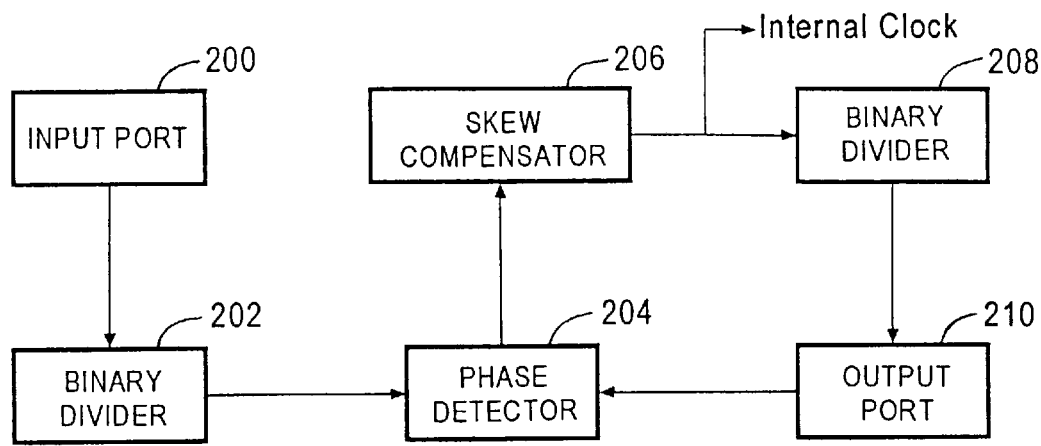
FIG. 2 is a block diagram of an input clock generation circuit according to an embodiment of the present invention.

With reference to FIG. 2, an embodiment of the invention employs a phase-locked loop (PLL) on an integrated circuit device which incorporates an output port in the loop. Specifically, the PLL comprises phase detector 204, skew compensator 206, binary divider 208, and output port 210 coupled in the respective order in a loop. Input port 200 is coupled to binary divider 202, which is coupled to another input of phase detector 204.

Input port 200 receives an external clock signal and transmits the external clock signal to binary divider 202, which divides the external clock signal to reduce the switching frequency of the circuit. Neither binary divider 202 nor binary divider 208 is necessary for the operation of the circuit but are preferably provided to reduce the power dissipation of output port 210.

The divided external clock signal from binary divider 202 is passed to phase detector 204. Phase detector 204 also receives an output signal from output port 210 and produces a phase error signal that is representative of the phase difference between the divided external clock signal and the output signal.

Skew compensator 206 is a controllable oscillating circuit that receives the phase error signal and responsively produces an internal clock signal at a phase and frequency that reduces the phase error between the fed back output signal and the divided external clock signal. Skew compensator 206 may be implemented, for example, by a current-controller oscillator (CCO) or preferably by a voltage controlled oscillator (VCO). The internal clock signal passes through binary divider 208 and is applied to output port 210.

Figure 3:
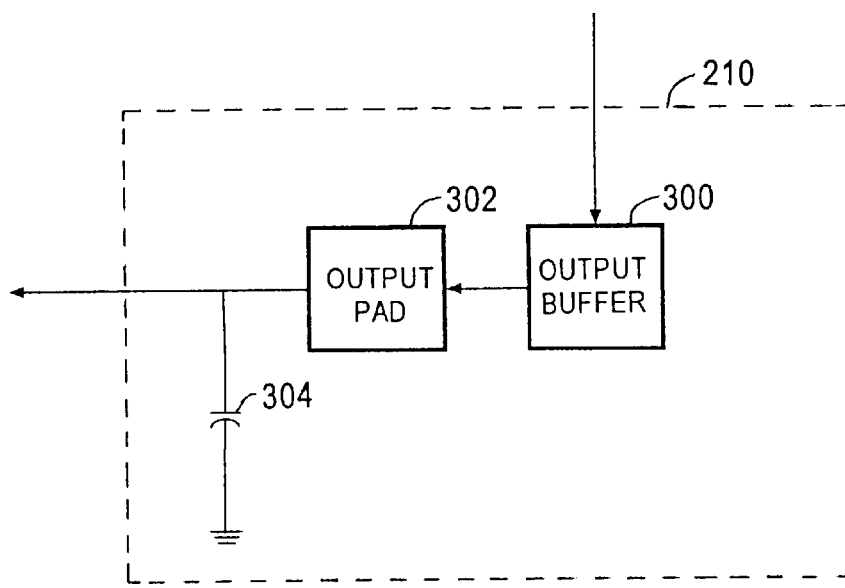
FIG. 3 is a block diagram of an output port according to an embodiment of the present invention.

In response, output port 210 outputs the divided internal clock signal as an output signal with a delay that approximates the delay of other loaded output ports on the semiconductor device. In particular, as shown in FIG. 3, output port 210 comprises output buffer 300, receiving a divided internal clock signal and producing a buffered output signal that approximates the buffering performed by other output ports of the integrated circuit device. Since the other output ports transmit signals to loaded output pads, output port 210 also comprises output pad 302 with capacitive load 304. Capacitive load 304 can be implemented by coupling output port 210 to a bus or with a capacitor designed to approximate the capacitive load of the bus.

Output buffer 300 outputs the buffered output signal to output pad 302 as loaded by capacitive load 304, producing the output signal with a delay that approximates the delay of other output ports of the integrated circuit device. The output signal, as delayed, is fed back to phase detector 204 to generate a new phase error signal.

By including an output port in the PLL coupled to the phase detecting circuit, the phase of the output signal from the output port is compared to the phase of the external clock signal. Accordingly, the internal clock signal, produced by skew compensator 206, is out-of-phase with respect to the external clock signal by an amount determined by the delay characteristics of output port 210.

Since output port 210 is on the same integrated circuit substrate as other output ports, the manufacturing, supply voltage, and temperature variations, which affect the input clock to output phase delay for the other output ports, also affect, in a similar way, the delay characteristics of output port 210. In this manner, the presence of output port 210 serves to measure $T_{CTO}$ for the particular operating environment of the integrated circuit and adjust the phase of the internal clock accordingly. Therefore, tighter tolerances for $T_{CTO}$ may be employed, advantageously reducing the contribution for output phase delay to the bus timing budget and facilitating increased data bandwidth.

REDUCING INTERNAL CLOCK JITTER

One drawback associated with employing a PLL to generate an internal clock signal is due to the nature of the controllable oscillating circuit of skew compensator 206. If the controllable oscillating circuit includes a voltage-controlled oscillator (VCO), then the VCO should initially have a high gain in order to quickly synchronize the VCO output to the reference voltage.

However, a high gain VCO is very sensitive to input voltage fluctuations even after the PLL has locked. As a result, the high gain VCO continually readjusts its output in response to the voltage fluctuations, producing clock jitter. Clock jitter disadvantageously increases the required tolerance for the output phase delay by making $T_{CTO}$ less predictable.

Accordingly, a preferred embodiment of the invention implements the skew compensator with a VCO having a gain adjust input (hereinafter a "programmable VCO"), such as the VCO described in the common assignee's U.S. patent application Ser. No. 08/770,333 entitled "Voltage-Controlled Oscillator with Programmable Gain Control" filed on Dec. 20, 1996 by James C. Morizio, incorporated herein by reference.

Figure 4A:
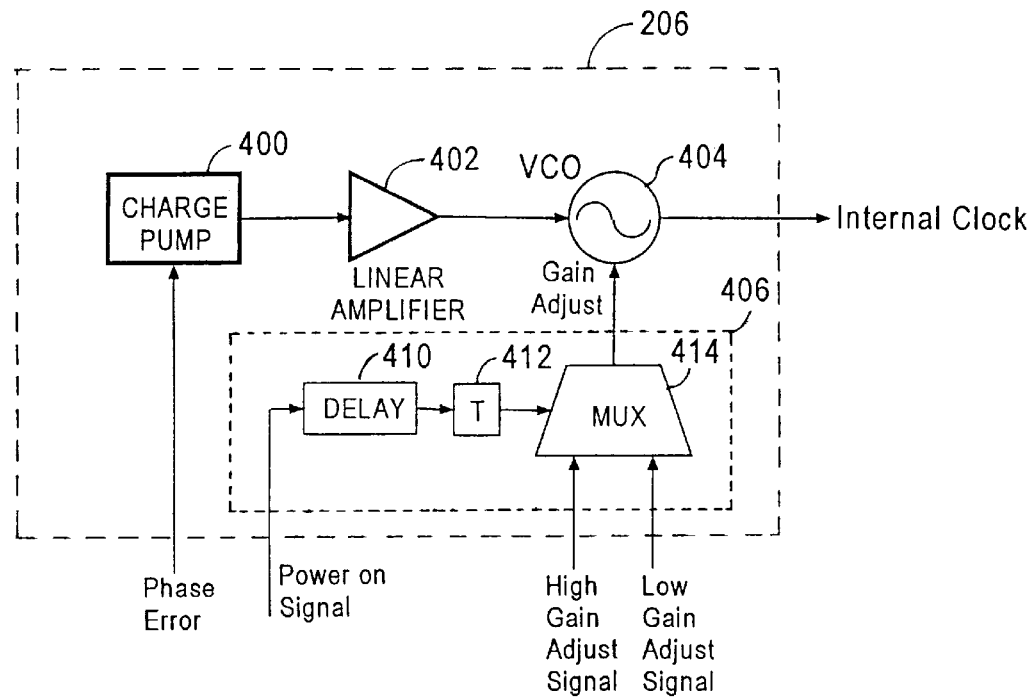
FIGS. 4(a) and 4(b) are block diagrams of a skew compensator according to embodiments of the present invention.

In FIG. 4(a), skew compensator 206 comprises charge pump 400, linear amplifier 402, programmable VCO 404, and jitter reduction circuit 406. Charge pump 400 is coupled to phase detector 204 and receives the phase error signal. In response, charge pump 400 produces a phase error voltage. The phase error voltage is applied to linear amplifier 402 which suppresses noise, removes high-frequency components of the phase error signal, and amplifies the phase error voltage to produce a control voltage for programmable VCO 404. Programmable VCO 404 produces the internal clock signal at a frequency responsive to the control voltage and a programmed gain adjust input.

According to one embodiment of the invention, shown in FIG. 4(a), jitter reduction circuit 406 comprises delay element 410 that delays a signal responsive to power on for a prescribed amount of time. The delayed signal toggles a flip-flop 412, controlling multiplexor 414 that selects one of two hard-wired gain adjust signals. Alternately, the gain adjust signal is produced with combinational logic as a function of the output of flip-flop 412. The prescribed amount of time of the delay element is set to be sufficient to allow the PLL to lock, and may be, for example, in the range of 1 to 10 microseconds.

Figure 4B:
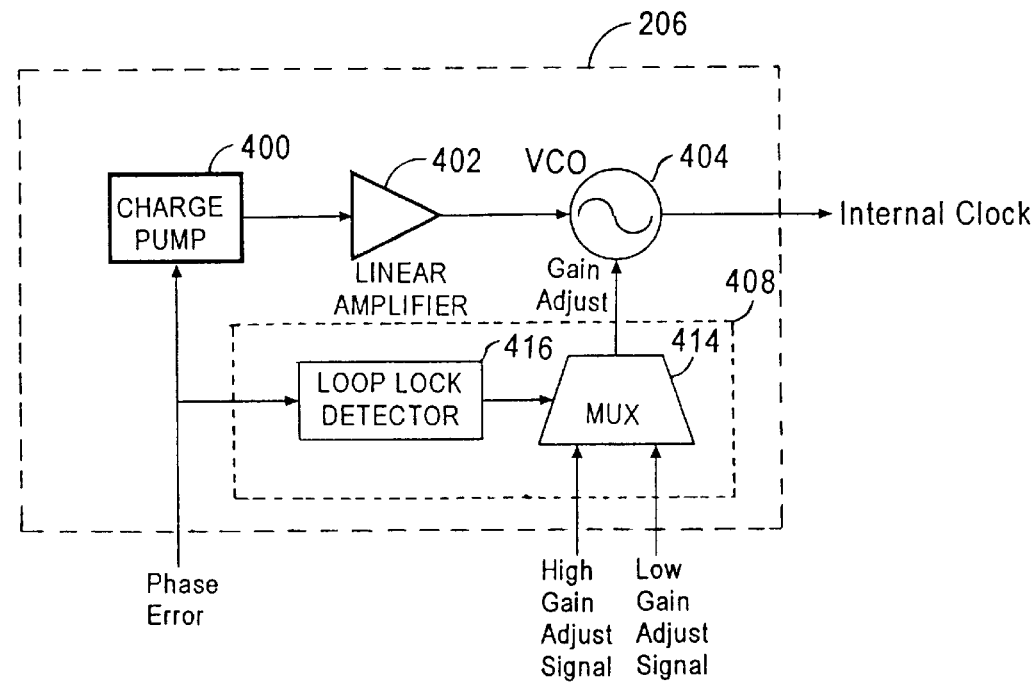

According to another embodiment of the invention, shown in FIG. 4(b), jitter reduction circuit 408 comprises multiplexor 414 controlled by loop lock detector 416. Loop lock detector is coupled to phase detector 204 for detecting whether a phase lock condition exists. When the phase lock condition is detected, loop lock detector 416 in response reduces the gain of programmable VCO 404, by controlling multiplexor 414. Alternately, the phase lock condition may be determined by examining the phase error voltage from charge pump 400, the control voltage from linear amplifier 402, or from a status bit on programmable VCO 404.

Initially, the programmed gain adjust input to programmable VCO 404 is set at the highest level for high-gain response. However, jitter reduction circuits 406 and 408 change the programmed gain adjust input to reduce the gain of programmable VCO 404 after the PLL has locked. Programmable VCO 404 is less sensitive to voltage fluctuations in the control voltage input when operating at a lower gain. As a result, programmable skew compensator 206 advantageously produces an internal clock signal with less clock jitter than a conventional, high-gain VCO.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A semiconductor device that produces an internal clock signal with reduced phase delay between an external clock signal and an output signal, comprising:

an input port of the semiconductor device configured for receiving said external clock signal;

an output port of the semiconductor device configured for producing said output signal;

a phase detecting circuit coupled to said input port and said output port and configured for comparing said external clock signal and said output signal and in response outputting a phase error signal; and a controllable oscillating circuit coupled to said phase detecting circuit and configured for generating said internal clock signal responsive to said phase error signal;

wherein said output port includes a pad and is coupled to said controllable oscillating circuit and further configured for producing said output signal in response to said internal clock signal.

2. The semiconductor device of claim 1, wherein said controllable oscillating circuit includes:

a voltage control circuit coupled to said phase detecting circuit and configured for generating a control voltage responsive to said phase error signal; and a voltage-controlled oscillating circuit coupled to said voltage control circuit and configured for generating said internal clock signal responsive to said control voltage.

3. The semiconductor device of claim 2, wherein said voltage control circuit includes:

a charge pump coupled to said phase detecting circuit and configured for producing a phase error voltage based on the phase error signal; and a linear amplifier coupled to said charge pump and said voltage-controlled oscillating circuit and configured for producing said control voltage based on said phase error voltage.

4. The semiconductor device of claim 2, further comprising a jitter reduction circuit, wherein:

said voltage-controlled oscillating circuit includes a gain adjust input for adjusting the gain thereof in response to a jitter reduction signal from said jitter reduction circuit; and said jitter reduction circuit is configured for producing said jitter reduction signal for reducing the gain of said voltage-controlled oscillating circuit after a phase lock condition has occurred.

5. The semiconductor device of claim 4, wherein said jitter reduction circuit is further coupled to said phase detecting circuit and further configured for producing said jitter reduction signal when said phase error signal signifies said phase lock condition.

6. The semiconductor device of claim 1, wherein said output port includes:

an output buffer coupled to said controllable oscillating circuit and configured for outputting a buffered output signal; and a capacitive load coupled to said pad and having a capacitance which introduces a delay in said output signal representative of a loaded output port.

7. The semiconductor device of claim 1, further comprising:

a first dividing circuit interspersed between and coupling said input port and said phase detecting circuit and configured for dividing said external clock signal by a divisor; and a second dividing circuit interspersed between and coupling said controllable oscillating circuit and said output port and configured for dividing said internal clock signal by said divisor.

8. A circuit for producing an internal clock signal with reduced phase delay between an external clock signal and an output signal, comprising:

a phase detecting circuit coupled to an input port for receiving said external clock signal therefrom and an output node for receiving said output signal therefrom, said phase detecting circuit configured for comparing said external clock signal and said output signal and in response outputting a phase error signal;

a voltage control circuit coupled to said phase detecting circuit and configured for generating a control voltage responsive to said phase error signal;

a voltage-controlled oscillating circuit coupled to said voltage control circuit and said output node and configured for generating said internal clock signal responsive to said control voltage, wherein said voltage-controlled oscillating circuit has a gain adjust input for adjusting the gain thereof in response to a jitter reduction signal and said output node is configured for producing said output signal in response to said internal clock signal; and a jitter reduction circuit coupled to said gain adjust input and configured for producing said litter reduction signal for reducing the gain of said voltage-controlled oscillating circuit after a phase lock condition has occurred;

wherein said jitter reduction circuit is further configured for delaying a toggle signal, responsive to power on, for a prescribed amount of time, sufficient to allow for said phase lock condition to occur, and for producing said jitter reduction signal in response to said delayed toggle signal.

9. The circuit of claim 8, wherein said output node is coupled to an output port of a semiconductor device.

10. The circuit of claim 9, wherein said output port includes:

an output buffer coupled to said voltage-controlled oscillating circuit and configured for outputting a buffered output signal;

a pad coupled to said output buffer and configured for outputting said output signal; and a capacitive load coupled to said pad and having a capacitance which introduces a delay in said output signal representative of a loaded output port.

11. An electronic system, comprising:

a first device having a first clock port and a first output port;

a second device having a second clock port and an input port;

a communications channel coupled to said first output port and to said input port; and a clock channel coupled to said first clock port and said second clock port and configured for supplying an external clock signal to said first device and said second device;

wherein said first device comprises:

a phase detecting circuit coupled to said first clock port and a second output port and configured for comparing said external clock signal and an output signal from said second output port and, in response, outputting a phase error signal; and a controllable oscillating circuit coupled to said phase detecting circuit and configured for generating an internal clock signal responsive to said phase error signal;

wherein said second output port of the first device includes a pad and is coupled to said controllable oscillating circuit and further configured for producing said output signal in response to said internal clock signal.

12. The system of claim 11, wherein said controllable oscillating circuit includes:

a voltage control circuit coupled to said phase detecting circuit and configured for generating a control voltage responsive to said phase error signal; and a voltage-controlled oscillating circuit coupled to said voltage control circuit and configured for generating said internal clock signal responsive to said control voltage.

13. The system of claim 12, wherein said voltage control circuit includes:

a charge pump coupled to said phase detecting circuit and configured for producing a phase error voltage based on the phase error signal; and a linear amplifier coupled to said charge pump and said voltage-controlled oscillating circuit and configured for producing said control voltage based on said phase error voltage.

14. The system of claim 12, wherein:

said first device further includes a jitter reduction circuit;

said voltage-controlled oscillating circuit includes a gain adjust input for adjusting the gain thereof in response to a jitter reduction signal from said jitter reduction circuit; and said jitter reduction circuit is configured for producing said jitter reduction signal for reducing the gain of said voltage-controlled oscillating circuit after a phase lock condition has occurred.

15. The system of claim 14, wherein said jitter reduction circuit is further configured for delaying a toggle signal, responsive to power on, for a prescribed amount of time, sufficient to allow for said phase lock condition to occur, and for producing said jitter reduction signal in response to said delayed toggle signal.

16. The circuit of claim 14, wherein said jitter reduction circuit is further coupled to said phase detecting circuit and further configured for producing said jitter reduction signal when said phase error signal signifies said phase lock condition.

17. The circuit of claim 11, wherein said second output port includes:

an output buffer coupled to said controllable oscillating circuit and configured for outputting a buffered output signal; and a capacitive load coupled to said pad and having a capacitance which introduces a delay in said output signal representative of a delay introduced by the first output port.

18. The circuit of claim 11, wherein said first device further comprises:

a first dividing circuit interspersed between and coupling said first clock port and said phase detecting circuit and configured for dividing said external clock signal by a divisor; and a second dividing circuit interspersed between and coupling said controllable oscillating circuit and said second output port and configured for dividing said internal clock signal by said divisor.

19. The system of claim 11, wherein said second output port is coupled to the communications channel.

20. A method of producing an internal clock signal within a device having an output port, comprising the steps of:

obtaining an output signal at said output port of said device, said output port including a pad;

receiving an external clock signal;

comparing the phase of said output signal to the phase of said external clock signal to produce a phase error signal;

generating said internal clock signal responsively to said phase error signal; and applying said internal clock signal to said output port of said device.

21. The method claim 20, wherein the step of generating said internal clock signal responsively from said phase error signal comprises the steps of:

initially generating said internal clock signal responsively to said phase error signal at a high gain; and generating said internal clock signal responsively to said phase error signal at a low gain after said output signal and said external clock signal are substantially in phase.

22. The method of claim 21, wherein the step of generating said internal clock signal responsively to said phase error signal at a low gain after said output signal and said external clock signal are substantially in phase includes the steps of:

detecting whether said output signal and said external clock signal are substantially in phase; and in response to detecting whether said output signal and said external clock signal are substantially in phase, generating said internal clock signal responsively to said phase error at a low gain.

23. A method of producing an internal clock signal within a device, comprising the steps of:

obtaining an output signal at an output node;

receiving an external clock signal;

comparing the phase of said output signal to the phase of said external clock signal to produce a phase error signal;

initially generating said internal clock signal responsively to said chase error signal at a high gain;

generating said internal clock signal responsively to said phase error signal at a low gain after waiting a prescribed amount of time following power on sufficient to allow said output signal and said external clock signal to be substantially in phase; and applying said internal clock signal to said output node.

24. The method of claim 23, wherein the step of obtaining the output signal at the output node includes the step of obtaining the output signal at an output port of a semiconductor device.

* * * * *